(12) United States Patent
Raghavan et al.

(10) Patent No.: US 6,750,709 B2
(45) Date of Patent: Jun. 15, 2004

(54) BIPOLAR TRANSISTOR-BASED LINEARIZER WITH PROGRAMMABLE GAIN AND PHASE RESPONSE SYSTEM

(75) Inventors: Gopal Raghavan, Thousand Oaks, CA (US); Michael G. Case, Carlsbad, CA (US); Carl Pobanz, Topanga, CA (US)

(73) Assignee: The Boeing Company, Chicago, IL (US)

( * ) Notice: Subject to any disclaimer, the term of this patent is extended or adjusted under 35 U.S.C. 154(b) by 158 days.

(21) Appl. No.: 10/021,423

(22) Filed: Nov. 30, 2001

(65) Prior Publication Data

US 2003/0102911 A1 Jun. 5, 2003

(51) Int. Cl.[7] .................................................. H03F 1/26
(52) U.S. Cl. .................................... 330/149; 330/124 R
(58) Field of Search .............................. 330/53, 124 R, 330/149, 136, 278

(56) References Cited

U.S. PATENT DOCUMENTS

| | | | |
|---|---|---|---|
| 4,462,001 A | | 7/1984 | Girard |
| 4,465,980 A | | 8/1984 | Huang et al. |
| 5,523,716 A | | 6/1996 | Grebliunas et al. |
| 5,568,087 A | | 10/1996 | Gatti |
| 5,589,797 A | * | 12/1996 | Gans et al. ................. 330/149 |
| 5,675,288 A | | 10/1997 | Peyrotte et al. |
| 5,736,898 A | | 4/1998 | Kohl et al. |
| 5,808,511 A | | 9/1998 | Kobayashi |
| 5,815,038 A | | 9/1998 | Ogura et al. |
| 5,915,213 A | | 6/1999 | Iwatsuki et al. |
| 5,966,049 A | | 10/1999 | Yuen et al. |
| 5,999,047 A | | 12/1999 | Zhang et al. |
| 5,999,718 A | | 12/1999 | Wang et al. |
| 6,016,076 A | | 1/2000 | Arell |
| 6,049,251 A | * | 4/2000 | Meyer ......................... 330/254 |
| 6,054,894 A | * | 4/2000 | Wright et al. ................ 330/149 |
| 6,075,411 A | * | 6/2000 | Briffa et al. ................. 330/149 |
| 6,246,286 B1 | * | 6/2001 | Persson ....................... 330/149 |
| 6,285,251 B1 | * | 9/2001 | Dent et al. ................... 330/127 |
| 6,356,149 B1 | * | 3/2002 | Stengel et al. .............. 330/107 |
| 6,466,628 B1 | * | 10/2002 | Kim ............................ 375/297 |
| 6,498,927 B2 | * | 12/2002 | Kang et al. ............... 455/245.2 |

* cited by examiner

Primary Examiner—Michael Tokar
Assistant Examiner—Linh V Nguyen
(74) Attorney, Agent, or Firm—Terje Gudmestad

(57) ABSTRACT

A bipolar transistor-based linearizer with programmable gain and phase response apparatus uses a splitter to separate an incoming RF signal into two equal components: in-phase (I) and quadrature (Q, ninety degrees delayed). The I signal then passes through a first bipolar variable gain amplifier (VGA) while the Q signal passes through a second bipolar VGA. After passing through the first and second VGAs, the amplified signals are combined at the output using a summer to produce a predistorted signal that drives a TWTA. The gains of each VGA are controlled using an RF power detector in conjunction with a bipolar gain/phase slope controller. Each gain can be adjusted separately to product a large range of linearization characteristics.

20 Claims, 1 Drawing Sheet

BIPOLAR TRANSISTOR-BASED LINEARIZER WITH PROGRAMMABLE GAIN AND PHASE RESPONSE SYSTEM

TECHNICAL FIELD

The present invention relates generally to linearizers, and more particularly, to a bipolar transistor-based linearizer with programmable gain and phase response.

BACKGROUND ART

Satellites and other spacecraft are in widespread use for various purposes including scientific research and communications. These scientific and communications missions, however, cannot be accurately fulfilled without wireless communication between a ground station and the spacecraft. In many applications, the satellite relies upon a wireless communication to send and receive electronic data to perform attitude and position corrections, diagnostic status checks, communication calculations and other functions. Without accurate wireless communication, proper satellite function is hindered and at times adversely effected.

Linearizers are commonly used to correct for gain compression and phase variation in both traveling-wave tube amplifiers (TWTAs) and solid state power amplifiers (SSPAs) to obtain improved linearity. Currently, TWTAs and SSPAs suffer a 'soft' or 'premature' clipping of the output power. As the output power deviates from the linear region the TWTA and SSPA introduce distortions that are unacceptable for communications. The function of a linearizer is to minimize this 'soft' clipping and make the output power of a TWTA or SSPA as close to 'ideal' as possible.

Linearizers are critical in maximizing the revenue from communications satellites by reducing capacity-limiting nonlinearity in transmission channels. They are necessary additions to each TWTA or SSPA on almost every communications satellite and represent a significant fraction of the payload cost. Accordingly, improved linearizer circuits have been aggressively sought after by nearly all producers of communications satellites.

Prior art linearizers have primarily relied on diodes and field effect transistors (FETs) as the nonlinear element within a mechanically tuned circuit to simultaneously match both gain and phase responses. Diode-based linearizers are hybrid modules with many separate parts that need to be individually soldered. Unfortunately, this results in a large and heavy linearizer with less than desirable electrical performance. Additionally, to achieve simultaneous gain and phase match, excessive amounts of manual tuning is required, and once the tuning process is completed, the linearizer's characteristics are fixed permanently.

The disadvantages associated with these conventional linearizer techniques have made it apparent that a new type of linearizer is needed. Preferably, the new linearizer would allow the gain characteristics to be modified at any time. Additionally, the new linearizer should reduce the size and mass of present linearizers while improving overall electrical performance. The present invention is directed to these ends.

SUMMARY OF THE INVENTION

It is, therefore, an object of this invention to provide an improved and reliable bipolar transistor-based linearizer with programmable gain and phase response system. Another object of the invention is to allow the gain characteristics to be modified at any time. An additional object of the invention is to reduce the size and mass of present linearizers while improving overall electrical performance.

In accordance with the objects of this invention, a bipolar transistor-based linearizer with programmable gain and phase response system is provided. In one embodiment of the invention, a bipolar transistor-based linearizer with programmable gain and phase response apparatus uses a splitter to separate an incoming RF signal into two equal components: in-phase (I) and quadrature (Q, ninety degrees delayed). The I signal then passes through a first bipolar variable gain amplifier (VGA) while the Q signal passes through a second bipolar VGA. After passing through the first and second VGAs, the amplified signals are combined at the output using a summer to produce a predistorted signal that drives a TWTA. The gains of each VGA are controlled using an RF power detector in conjunction with a bipolar gain/phase slope controller. Each gain can be adjusted separately to produce a large range of linearization characteristics.

The present invention thus achieves an improved bipolar transistor-based linearizer with programmable gain and phase response. The present invention is advantageous in that it is capable of being electronically tuned of a lifecycle to account for tube aging and environmental effects.

Additional advantages and features of the present invention will become apparent from the description that follows and may be realized by means of the instrumentalities and combinations particularly pointed out in the appended claims taken in conjunction with the accompanying drawings.

BRIEF DESCRIPTION OF THE DRAWINGS

In order that the invention may be well understood, there will now be described some embodiments thereof taken by way of example, reference being made to the accompanying drawings in which.

BEST MODES FOR CARRYING OUT THE INVENTION

Figure 1:
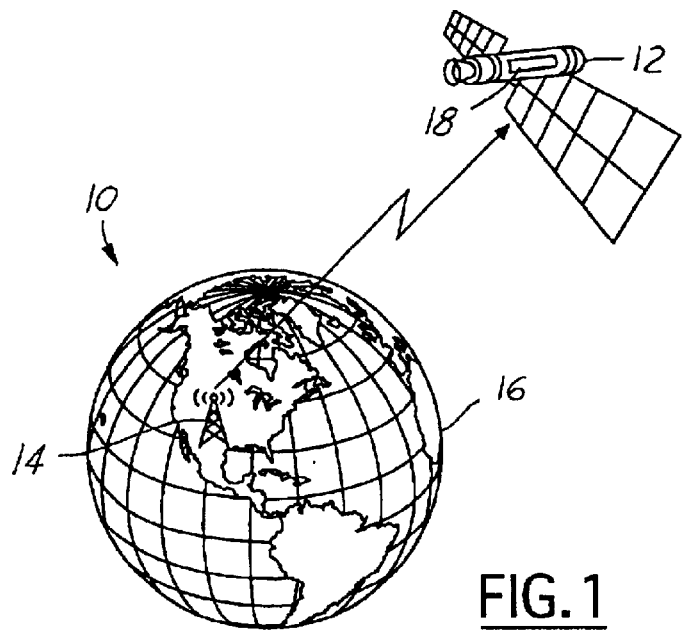
FIG. 1 is a perspective view of a satellite system having a bipolar transistor-based linearizer with programmable gain and phase response in accordance with one embodiment of the present invention.

In the following Figures, the same reference numerals will be used to identify identical components of the various views. The present invention is illustrated with respect to a bipolar transistor-based linearizer with programmable gain and phase response particularly suited for the aerospace field. However, the present invention is applicable to various and other uses that may require a bipolar transistor-based linearizer with programmable gain and phase response.

Referring to FIG. 1, a perspective view of a satellite system 10 having a bipolar transistor-based linearizer with programmable gain and phase response 18 in accordance with one embodiment of the present invention is illustrated. The satellite system 10 is comprised of one or more satellites 12 in communication with a ground station 14 located on the Earth 16. Each satellite includes a bipolar transistor-based linearizer with programmable gain and phase response 18.

Prior art linearizers have primarily relied on diodes and field effect transistors (FETs) as the nonlinear element within a mechanically tuned circuit to simultaneously match both gain and phase responses. The present invention is the first instance of a bipolar transistor based linearizer. The uniformity, speed, and integration of these devices permits revolutionary improvements in assembly time, cost and size versus the prior art. This invention allows for independent and dynamic programming of the gain and phase slopes through control voltages, which in turn allows a single part to be used in a variety of applications under differing conditions, and allows for better linearization in comparison to prior techniques.

Figure 2:
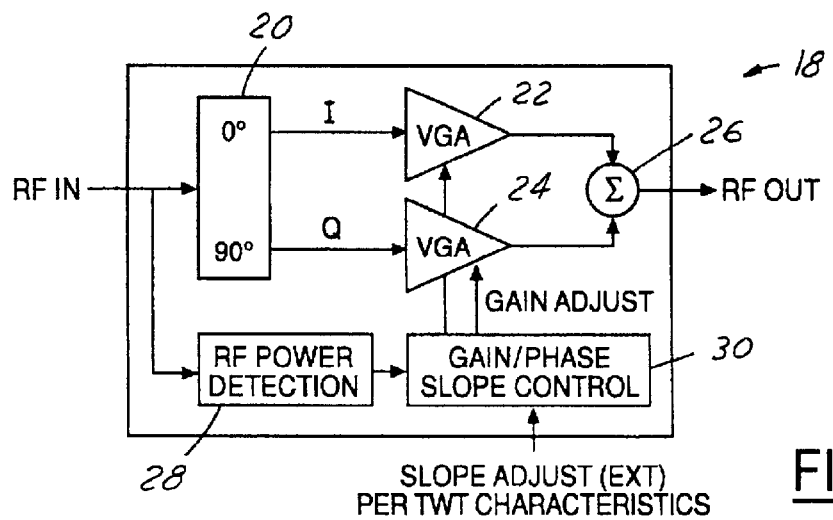
FIG. 2 is a block diagram of a bipolar transistor-based linearizer with programmable gain and phase response according to the present invention.

Referring to FIG. 2, a block diagram of a bipolar transistor-based linearizer with programmable gain and phase response 18 according to the present invention is illustrated. Linearizer 18 first uses a splitter 20 to split an incoming RF signal into two equal components: in-phase (I) and quadrature (Q, ninety degrees delayed). The I/Q splitter 20 is typically implemented as a standard microwave hybrid transformer. The I signal then passes through a first variable gain amplifier (VGA) 22 while the Q signal passes through a second VGA 24. After passing through the first and second VGAs 22, 24, the signals are combined at the output using a summer 26 to produce a predistorted signal that drives a TWTA.

Predistortion of both amplitude and phase are required to compensate for the nonlinearity of the TWTA. This is achieved in the present invention by allowing the amplitude of the incoming signal to control the gain of both VGAs 22, 24. By increasing the gains of both VGAs 22, 24 equally as the power increases, the overall gain increases while the phase remains constant, thus compensating for gain compression in the TWTA. By increasing the gain in one amplifier while reducing the gain in the other, phase can be altered with constant amplitude. By controlling the I and Q signal responses over input power variation, nearly any linearization characteristic is possible.

An RF power detector 28, is coupled to the RF in signal and detects the power of the incoming RF signal. The RF power detector 28 may be either realized as a diode or as a logarithmic amplifier. Detector 28 is coupled to a gain/phase slope control element 30, which adjusts the gains of both VGAs 22, 24. Slope control element 30 also includes a slope adjust input for modifying system performance based upon TWTA characteristics.

Figure 3:
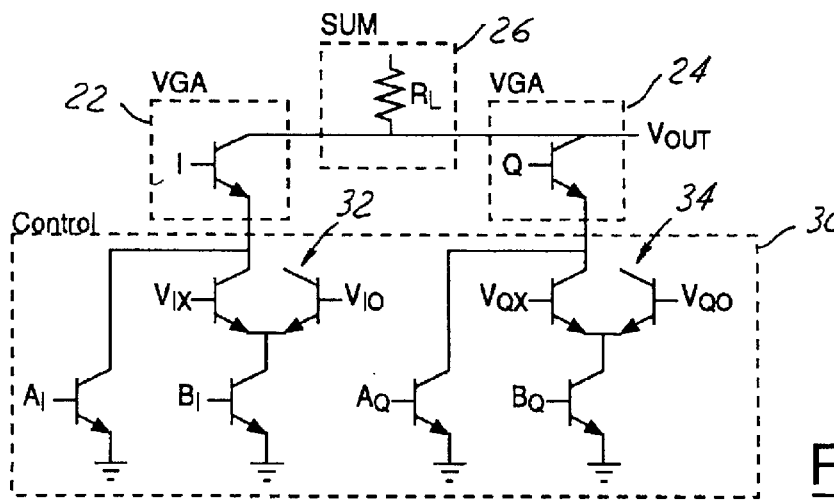
FIG. 3 is a circuit block diagram of two VGAs, summing and control circuits according to the present invention.

Referring to FIG. 3, a circuit block diagram of two VGAs 22, 24, summing 26 and control 30 circuits according to the present invention are illustrated. The VGAs 22, 24 are realized as common-emitter amplifiers whose emitter current controls amplifier gain. A I differential amplifier 32 and a Q differential amplifier 34 amplifies the difference between the detected power and a settable reference signal to set each VGA 22, 24 current. By connecting the collectors of both VGAs 22, 24 to a single load resistor, the outputs are summed.

The voltage from power detector 28 is linear with the input power Pin, but the response may be different for the I and Q signals, as shown by:

$$V_{IX} = a + bP_{in} \quad (1)$$

$$V_{QX} = c + dP_{in} \quad (2)$$

The detector 28 coefficients a and b (c and d), currents $A_I$ and $B_I$ ($A_Q$ and $B_Q$) and voltage $V_{IO}$ ($V_{QO}$) set the offset and range of the VGA 22, 24 gain versus RF input power characteristic for the I (Q) channel. The VGAs 22, 24 comprise single bipolar transistors, whose RF transconductance varies linearly with collector current I as qI/kTn, where q is the electron charge, k is Boltzmann's constant and T is absolute temperature. RF signals at the I and Q ports thus experience a voltage gain of $R_L qI/kT$ that is variable as a result of the dependent currents in the bias transistors. These transistors have current gain β. The variable RF voltage gains are thus expressed:

$$\text{Gain}_I = \frac{q\beta R_L}{kT}\left(A_I + B_I \frac{e^{\frac{q}{kT}(a+bP_{in}-V_{IO})}}{1 + e^{\frac{q}{kT}(a+bP_{in}-V_{IO})}}\right) \quad (3)$$

$$\text{Gain}_Q = \frac{q\beta R_L}{kT}\left(A_Q + B_{qI} \frac{e^{\frac{q}{kT}(c+dP_{in}-V_{QO})}}{1 + e^{\frac{q}{kT}(c+dP_{in}-V_{QO})}}\right) \quad (4)$$

The present invention thus demonstrates an improved linearizer with programmable gain and phase response by using bipolar transistors. In this way, the present invention allows the gain characteristics to be modified at any time. Additionally, the present invention reduces the size, cost, and mass of present linearizers while improving overall electrical performance.

From the foregoing, it can be seen that there has been brought to the art a new and improved bipolar transistor-based linearizer with programmable gain and phase response system. It is to be understood that the preceding description of the preferred embodiment is merely illustrative of some of the many specific embodiments that represent applications of the principles of the present invention. Clearly, numerous and other arrangements would be evident to those skilled in the art without departing from the scope of the invention as defined by the following claims.

What is claimed is:

1. A linearizer for correcting gain compression and phase variation of a radio frequency input signal, said linearizer comprising:

a radio frequency (RF) input;

a splitter coupled to said RF input and receiving the RF input signal, said splitter separating said RF input signal into an in-phase (I) signal and a quadrature (Q) signal, wherein said Q signal is delayed ninety degrees behind said I signal;

a first variable gain amplifier (VGA) having an adjustable first gain, said first VGA coupled to said splitter and amplifying said I signal to generate an amplified I signal;

a second variable gain amplifier (VGA) having an adjustable second gain, said second VGA coupled to said splitter and amplifying said Q signal to generate an amplified Q signal;

a RF power detector coupled to said RF input and receiving the RF input signal, said RF power detector generating an RF power signal corresponding to the power of the RF input signal;

a controller coupled to said RF power detector and receiving said RF power signal, said controller including control logic operative to adjust said adjustable first and second gains to control linearization response; and a summer coupled to said first and second VGAs and summing said amplified I and Q signals to generate a linearized RF output.

2. The linearizer for correcting gain compression and phase variation of a radio frequency input signal as recited in claim 1, wherein said splitter comprises a microwave hybrid transformer.

3. The linearizer for correcting gain compression and phase variation of a radio frequency input signal as recited in claim 1, wherein said first VGA comprises a bipolar device.

4. The linearizer for correcting gain compression and phase variation of a radio frequency input signal as recited in claim 3, wherein said first VGA comprises a common-emitter amplifier.

5. The linearizer for correcting gain compression and phase variation of a radio frequency input signal as recited in claim 1, wherein said second VGA comprises a bipolar device.

6. The linearizer for correcting gain compression and phase variation of a radio frequency input signal as recited in claim 5, wherein said second VGA comprises a common-emitter amplifier.

7. The linearizer for correcting gain compression and phase variation of a radio frequency input signal as recited in claim 1, wherein said first and second adjustable gains are increased equally, thereby increasing overall gain while keeping phase constant.

8. The linearizer for correcting gain compression and phase variation of a radio frequency input signal as recited in claim 1, wherein said first and second adjustable gains are increased differently, thereby modifying overall phase while keeping gain constant.

9. The linearizer for correcting gain compression and phase variation of a radio frequency input signal as recited in claim 1, wherein said RF power detector comprises a diode.

10. The linearizer for correcting gain compression and phase variation of a radio frequency input signal as recited in claim 1, wherein said RF power detector comprises a logarithmic amplifier.

11. The linearizer for correcting gain compression and phase variation of a radio frequency input signal as recited in claim 1, wherein said controller comprises a plurality of bipolar devices.

12. The linearizer for correcting gain compression and phase variation of a radio frequency input signal as recited in claim 1, wherein said controller includes control logic operative to adjust said first and second gains based upon a settable reference signal, said settable reference signal corresponding to a set of extrinsic characteristics of a traveling wave tube amplifier.

13. The linearizer for correcting gain compression and phase variation of a radio frequency input signal as recited in claim 1, wherein said summer comprises a resistor.

14. A satellite communications system, comprising:
a ground station;
a satellite in orbit and in communication with said ground station, said satellite having a linearizer for correcting gain compression and phase variation of a radio frequency input signal comprising:
a radio frequency (RF) input;
a splitter coupled to said RF input and receiving the RF input signal, said splitter separating said RF input signal into an in-phase (I) signal and a quadrature (Q) signal, wherein said Q signal is delayed ninety degrees behind said I signal;
a first variable gain amplifier (VGA) having an adjustable first gain, said first VGA coupled to said splitter and amplifying said I signal to generate an amplified I signal;
a second variable gain amplifier (VGA) having an adjustable second gain, said second VGA coupled to said splitter and amplifying said Q signal to generate an amplified Q signal;
a RF power detector coupled to said RF input and receiving the RF input signal, said RF power detector generating an RF power signal corresponding to the power of the RF input signal;
a controller coupled to said RF power detector and receiving said RF power signal, said controller including control logic operative to adjust said adjustable first and second gains to control linearization response; and
a summer coupled to said first and second VGAs and summing said amplified I and Q signals to generate a linearized RF output.

15. The satellite communications system as recited in claim 14, wherein said first VGA comprises a bipolar device.

16. The linearizer for correcting gain compression and phase variation of a radio frequency input signal as recited in claim 15, wherein said first VGA comprises a common-emitter amplifier.

17. The satellite communications system as recited in claim 14, wherein said second VGA comprises a bipolar device.

18. The satellite communications system as recited in claim 17, wherein said second VGA comprises a common-emitter amplifier.

19. The satellite communications system as recited in claim 14, wherein said controller comprises a plurality of bipolar devices.

20. The satellite communications system as recited in claim 14, wherein said controller includes control logic operative to adjust said first and second gains based upon a settable reference signal, said settable reference signal corresponding to a set of extrinsic characteristics of a traveling wave tube amplifier.

* * * * *